(12) United States Patent
Roohparvar

(10) Patent No.: US 7,719,917 B2
(45) Date of Patent: *May 18, 2010

(54) METHOD AND APPARATUS FOR MANAGING BEHAVIOR OF MEMORY DEVICES

(75) Inventor: Fariborz F. Roohparvar, Monte Sereno, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/393,464

(22) Filed: Feb. 26, 2009

(65) Prior Publication Data

US 2009/0161473 A1 Jun. 25, 2009

Related U.S. Application Data

(63) Continuation of application No. 11/449,754, filed on Jun. 9, 2006, now Pat. No. 7,512,029.

(51) Int. Cl.
*G11C 5/14* (2006.01)

(52) U.S. Cl. .................... 365/226; 365/227; 713/322

(58) Field of Classification Search ............ 365/185.02; 713/322
See application file for complete search history.

(56) References Cited

U.S. PATENT DOCUMENTS

| 4,716,551 | A | 12/1987 | Inagaki |
| 4,792,891 | A | 12/1988 | Baba |
| 4,899,272 | A | 2/1990 | Fung et al. |
| 5,005,157 | A | 4/1991 | Catlin |
| 5,132,932 | A | 7/1992 | Tobita |
| 5,485,429 | A | 1/1996 | Ono |
| 5,495,452 | A | 2/1996 | Cha |
| 5,640,357 | A | 6/1997 | Kakimi |
| 5,680,359 | A | 10/1997 | Jeong |
| 5,717,644 | A | 2/1998 | Hadderman et al. |
| 5,721,860 | A | 2/1998 | Stolt et al. |
| 5,801,987 | A * | 9/1998 | Dinh ..................... 365/185.18 |
| 5,805,517 | A | 9/1998 | Pon |
| 5,956,289 | A | 9/1999 | Norman et al. |
| 6,014,611 | A * | 1/2000 | Arai et al. ..................... 702/132 |
| 6,166,990 | A | 12/2000 | Ooishi et al. |
| 6,182,232 | B1 * | 1/2001 | Klein ......................... 713/340 |
| 6,438,057 | B1 | 8/2002 | Ruckerbauer |
| 6,564,288 | B2 | 5/2003 | Olarig et al. |
| 6,643,081 | B1 | 11/2003 | Walker et al. |
| 6,735,137 | B2 | 5/2004 | Jung et al. |
| 6,756,856 | B2 | 6/2004 | Song et al. |
| 6,916,707 | B2 | 7/2005 | Rudeck |
| 6,975,538 | B2 | 12/2005 | Abedifard et al. |
| 6,977,842 | B2 | 12/2005 | Nazarian |
| 6,981,159 | B2 * | 12/2005 | Maeda ....................... 713/300 |
| 6,982,905 | B2 | 1/2006 | Nguyen |
| 7,009,904 | B2 | 3/2006 | Kim |
| 7,184,349 | B2 | 2/2007 | Sako |
| 7,330,378 | B2 | 2/2008 | Perner et al. |

(Continued)

*Primary Examiner*—Tan T. Nguyen
(74) *Attorney, Agent, or Firm*—Dickstein Shapiro LLP

(57) ABSTRACT

A method of managing power consumption by a memory in a memory device includes determining whether the device is powered by a depletable power supply, and if it is determined that the device is powered by a depletable power supply, changing a behavior of the memory to regulate power consumed by the memory.

19 Claims, 8 Drawing Sheets

U.S. PATENT DOCUMENTS

| | | | |
|---|---|---|---|
| 7,512,029 B2 * | 3/2009 | Roohparvar | 365/226 |
| 2002/0027805 A1 | 3/2002 | Roohparvar | |
| 2005/0195651 A1 | 9/2005 | Roohparvar | |
| 2006/0044887 A1 | 3/2006 | Roohparvar | |
| 2006/0098512 A1 | 5/2006 | Tanaka et al. | |

* cited by examiner

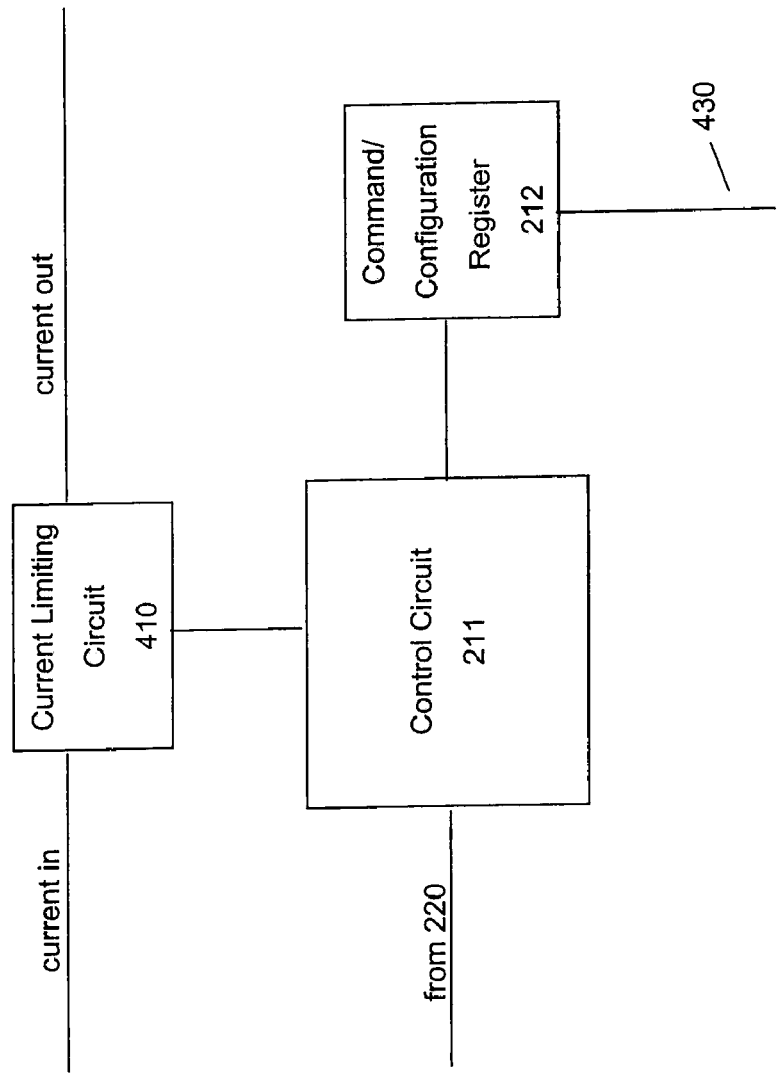

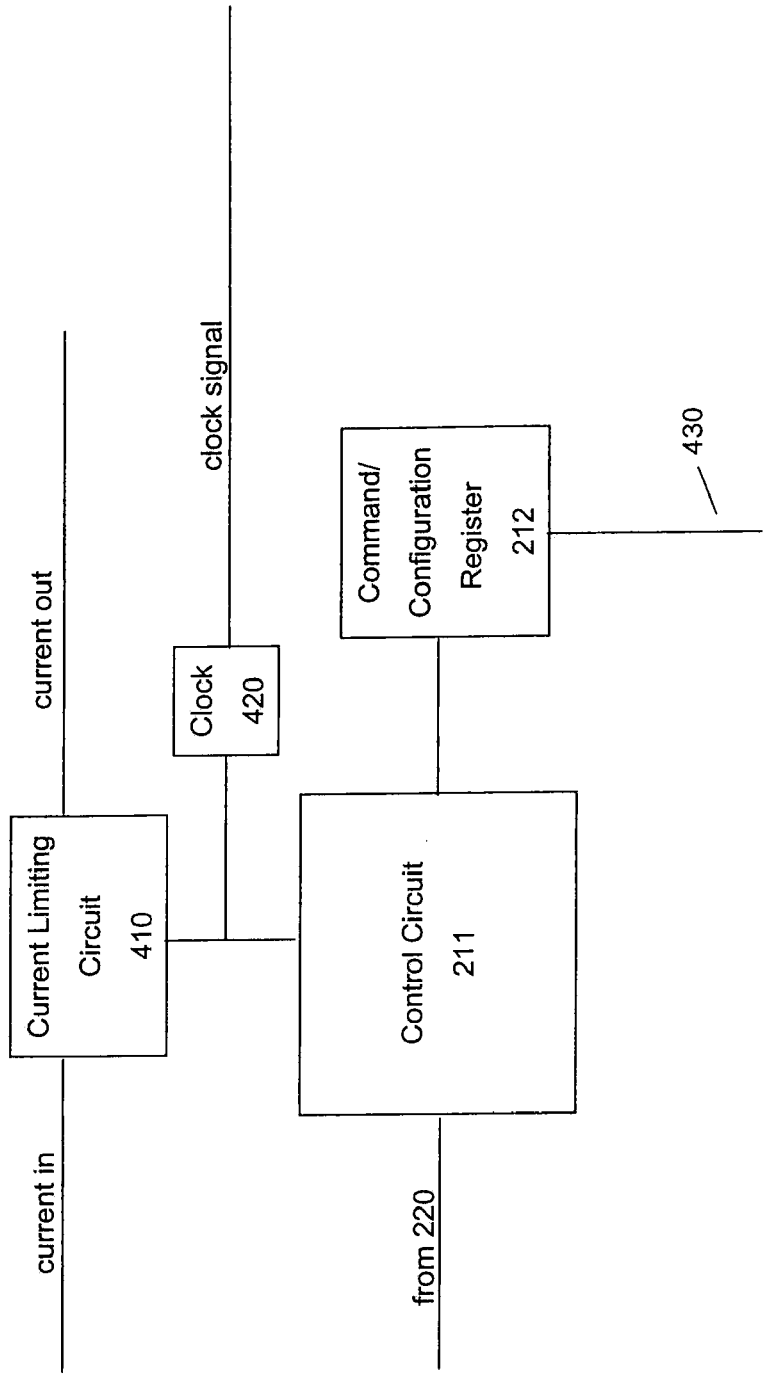

METHOD AND APPARATUS FOR MANAGING BEHAVIOR OF MEMORY DEVICES

CROSS-REFERENCE TO RELATED APPLICATIONS

This application is a continuation of U.S. patent application Ser. No. 11/449,754, filed on Jun. 9, 2006 now U.S. Pat. No. 7,512,029, the subject matter of which is incorporated in its entirety by reference herein.

FIELD OF THE INVENTION

The present invention relates generally to memory devices and in particular to managing behavior of, including power consumption trade-offs in, flash memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, portable music players, and cellular telephones. Program code, system data such as a basic input/output system (BIOS), and other firmware can typically be stored in flash memory devices. Many electronic devices are designed with a single flash memory device.

Two common types of flash memory array architectures are the "NAND" and "NOR" architectures, so called for the resemblance which the basic memory cell configuration of each architecture has to a basic NAND or NOR gate circuit, respectively. In the NOR array architecture, the floating gate memory cells of the memory array are arranged in a matrix. The gates of each floating gate memory cell of the array matrix are connected by rows to word select lines (word lines) and their drains are connected to column bit lines. The source of each floating gate memory cell is typically connected to a common source line. The NOR architecture floating gate memory array is accessed by a row decoder activating a row of floating gate memory cells by selecting the word line connected to their gates. The row of selected memory cells then place their stored data values on the column bit lines by flowing a differing current if in a programmed state, or non-programmed state from the connected source line to the connected column bit lines.

A NAND array architecture also arranges its array of floating gate memory cells in a matrix such that the gates of each floating gate memory cell of the array are connected by rows to word lines. However each memory cell is not directly connected to a source line and a column bit line. Instead, the memory cells of the array are arranged together in strings, typically of 8, 16, 32, or more each, where the memory cells in the string are connected together in series, source to drain, between a common source line and a column bit line. The NAND architecture floating gate memory array is then accessed by a row decoder activating a row of floating gate memory cells by selecting the word select line connected to their gates. In addition, the word lines connected to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series connected string, restricted only by the memory cells of each string that are selected to be read, thereby placing the current encoded stored data values of the row of selected memory cells on the column bit lines.

NAND flash memory array architectures of the type discussed above are generally known as discussed, for example, in U.S. Pat. Nos. 6,975,538 and 6,977,842, assigned to Micron Technology, Inc., which are hereby incorporated by reference in their entirety.

NAND flash memory devices are being used more and more in consumer electronics due to the potentially high memory densities at relatively low cost. In order to get higher and higher capacities, system designers are putting more and more dies in the same package to get those desired densities. Dual die packages as well as quad die packages increase density, but they also create issues with current consumption and noise. Environmental factors may also increasingly affect operation of memory devices, especially those with high packing densities.

Consumer devices such as those described also have operating modes with which a system designer may be concerned, depending on environmental factors. For instance, a handheld device may have two modes of operation: a first for high performance operation where the device is plugged into an outlet and there is no concern for power depletion, and a second for modes where a battery is used and peak currents and depletion of power are issues.

NAND memories have operating cycles that consume large amounts of current. Such current peaks can be reduced, but the performance of the memory would be adversely impacted. By placing circuits that limit the current in the charging path of some cycles, the maximum current could be controlled. However, it would take longer to pass that amount of current to the node that needs it. Also, as mentioned earlier, the device that is sold to the system designer may include multiple stacked NAND flash memories. In those cases, the peak currents add up and create significant problems for the system. In a system where the die is used in a quad stack, the total peak current gets quadrupled. The system designer may want smaller peak currents which may negatively impact device performance.

Accordingly, there is a need in the art for an improved method and apparatus for managing operation of an integrated circuit device in accordance with environmental influences, such as, for example, the power consumption in a an integrated circuit, for example, memory devices with a flash memory device, being one example of a memory device.

BRIEF DESCRIPTION OF THE DRAWINGS

The foregoing and other advantages and features of the invention will be more readily understood from the following detailed description of the invention provided below with reference to the accompanying drawings, in which:

FIGS. 4A, 4B, and 4C are block diagrams of a memory constructed in accordance with the invention;

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of the embodiments of the invention; however, the sequence of steps is not limited to that set forth herein and may be changed as is known in the art, with the exception of steps necessarily occurring in a certain order. Also, although the invention is described with reference to a flash memory device, the invention may also be employed with other integrated circuits where operational management, e.g., power management, is desired. In the ensuing description, the environmental influence of how an integrated circuit device, e.g., a memory device, is powered is used to affect operation of the device. However, the invention is not limited to how a device is powered as the environmental influence, as other environmental influences, such as temperature, humidity, power supply or other noise condition, pressure, electromagnetic interference (EMI), and other environmental parameters which may affect operation of the integrated circuit may be used as a sensed parameter for changing operations of the integrated circuit.

In accordance with exemplary embodiments of the invention, a technique for method of managing power consumption by a memory in a memory device includes determining whether the device is powered by a depletable power supply, and if it is determined that the device is powered by a depletable power supply, changing a behavior of the memory to regulate power consumption. Furthermore, in accordance with exemplary embodiments of the invention, a method of managing power consumption by a memory in a memory device includes determining whether the device is powered by a current-dependent power supply, and if it is determined that the device is powered by a current-dependent power supply, changing a behavior of the memory to lower power consumption. The user, e.g., the system designer, may predetermine the behavior to be changed by storing within the device operational control parameters which are selected in accordance with how the device is powered.

Figure 1:
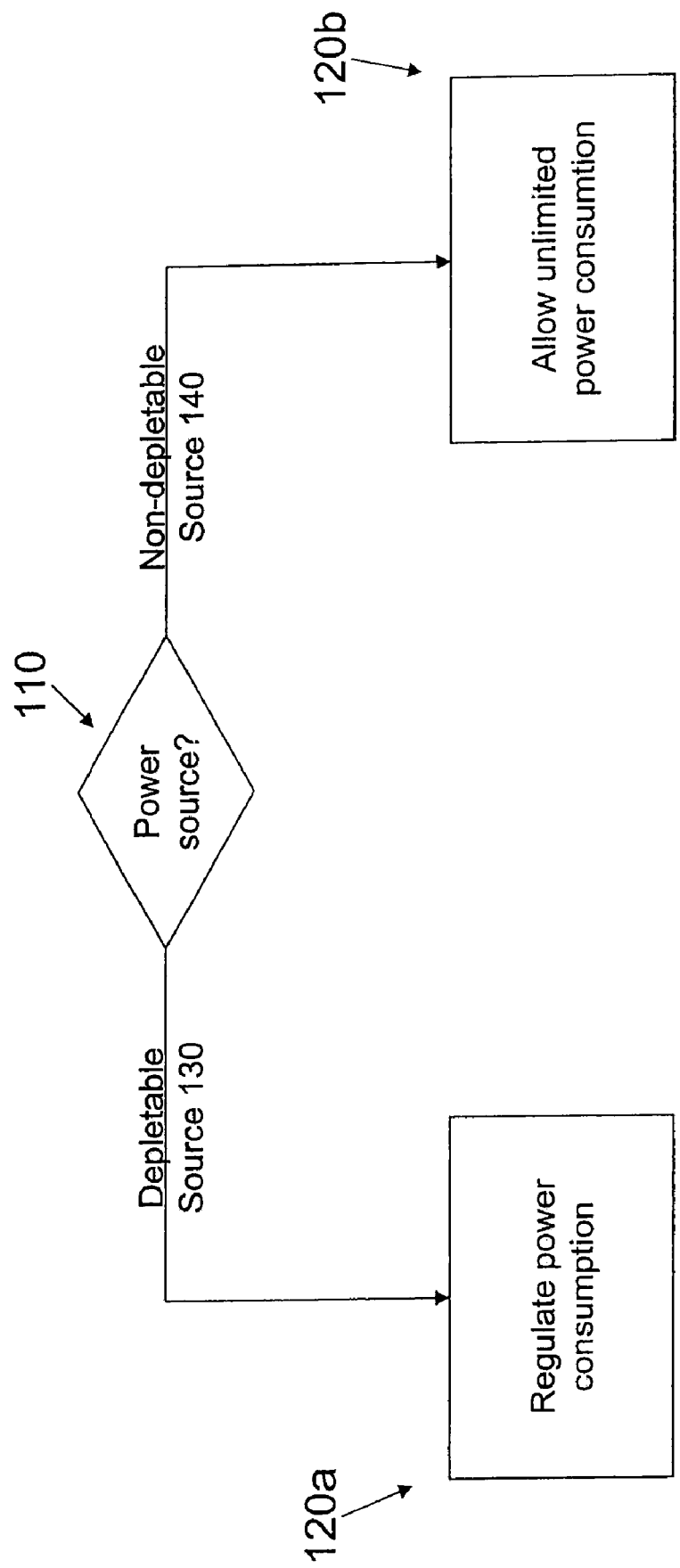
FIG. 1 is a flowchart of a method in accordance with the invention.

Now referring to the figures, where like numerals designate like elements, FIG. 1 is a flowchart describing a method of managing power consumption of a flash memory device, e.g. a NAND flash memory device, according to an exemplary embodiment of the invention. At step 110, it is determined by a determining circuit (FIGS. 2 and 3) for a flash memory device whether the power source of the device is a depletable power source 130, such as a battery, or a non-depletable power source 140, such as a wall outlet power source or a computer connection. The non-depletable power source 140 may also supply power to the NAND flash memory device through the depletable power source 130, such as occurs during charging or re-charging of a battery or other type of depletable power source. This will be detected as the non-depletable power source 140.

Step 120a requires power consumption to be lowered when the power source is a depletable power source 130. Accordingly a behavior of the memory which affects power consumption is changed in a way to lower power consumption. This may be effected, for instance, by decreasing the speed of write operations of the NAND flash memory 210 (FIG. 2), or by decreasing the maximum current supplied to the NAND flash memory 210. These are but two non-limiting examples of how the behavior of the memory may be changed to lower power consumption. If the power source is a non-depletable power source 140, then unlimited power consumption is allowed (step 120b). The foregoing steps may be implemented in software, if desired.

Figure 2:
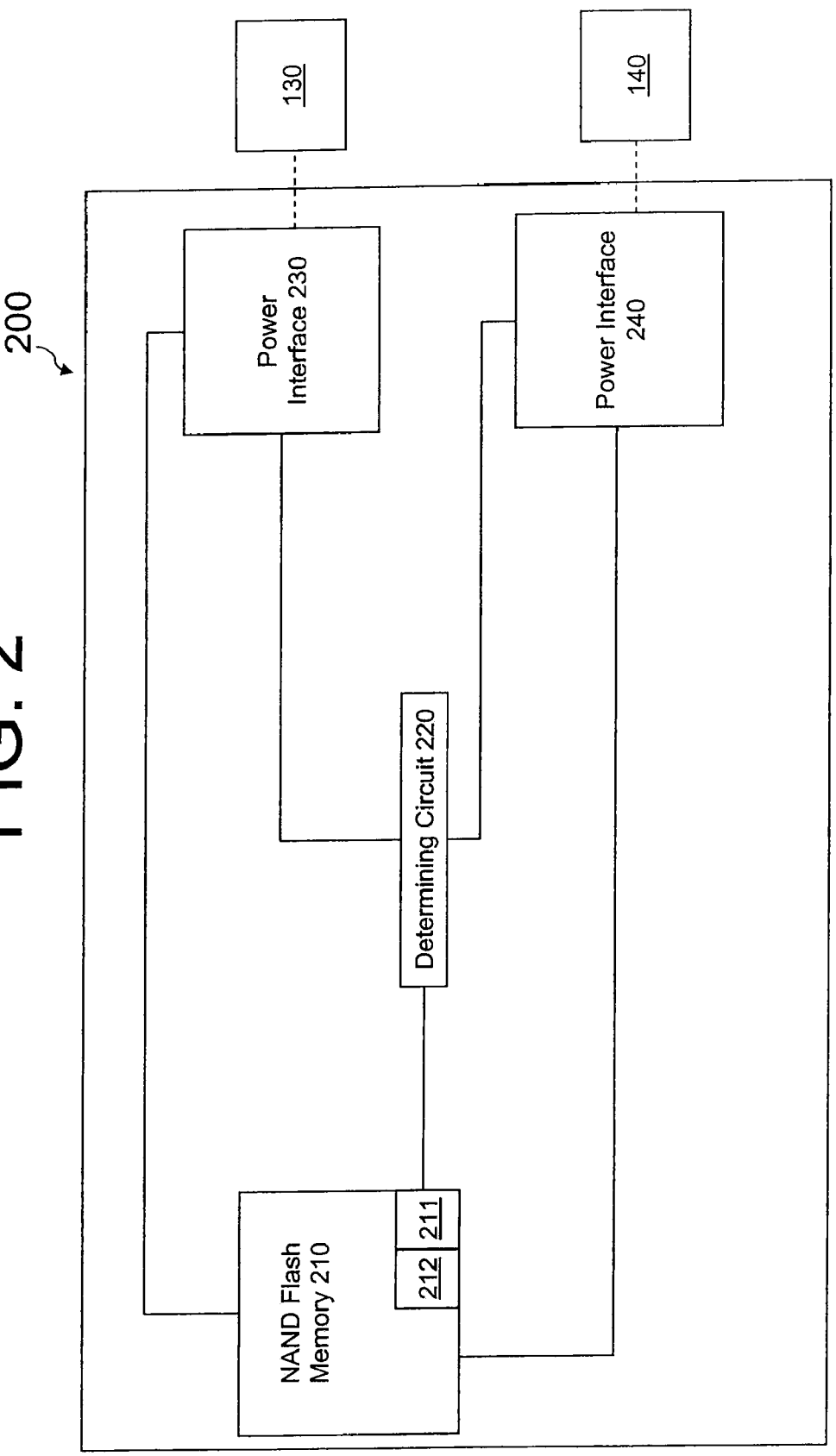
FIG. 2 is a block diagram of a first exemplary portable device including a memory constructed in accordance with the invention.

FIG. 2 illustrates a first exemplary portable memory device 200 including a NAND flash memory 210 constructed in accordance with the invention. Portable memory device 200 includes a first power interface 230, second power interface 240, NAND flash memory 210, and a determining circuit 220. NAND flash memory 210 includes a control circuit 211, which may be accessed by the determining circuit 220, and a command/configuration register 212.

The first power interface 230 is used to connect portable memory device 200 to depletable power source 130, and the second power interface 240 is used to connect portable memory device 200 to non-depletable power source 140. Determining circuit 220 determines which power interface 230, 240 is actually receiving power for portable memory device 200. If determining circuit 220 detects that power is being received through second power interface 240, no further action is taken by determining circuit 220, and NAND flash memory 210 is allowed to draw all power required from non-depletable power source 140 via second power interface 240 for any operation.

However, if determining circuit 220 detects that power is being received through first power interface 230, then determining circuit 220 instructs control circuit 211 within NAND flash memory 210 to utilize power according to predetermined trade-off conditions, which are stored as operational parameters by a user as one or more values in command/configuration register 212. Control circuit 211 accesses the one or more values from command/configuration register 212 corresponding to the predetermined trade off condition, and instructs other circuitry (not shown) within the NAND flash memory 210 to perform accordingly. As discussed above, the power utilization may be effected, for instance, by decreasing the speed of write operations of the NAND flash memory 210 by controlling a write command clock frequency, or by decreasing the maximum current supplied to the NAND flash memory 210 through a current limiting circuit.

In an alternate embodiment, the non-depletable power source 140 may be connected through the first power interface 230. For instance, the non-depletable power source 140 may be supplied to and through the depletable power source 130, such as occurs during charging or re-charging of a battery or other type of depletable power source. In that case, determining circuit 220 may also detect the non-depletable power source 140 through the first interface 230.

Figure 3:
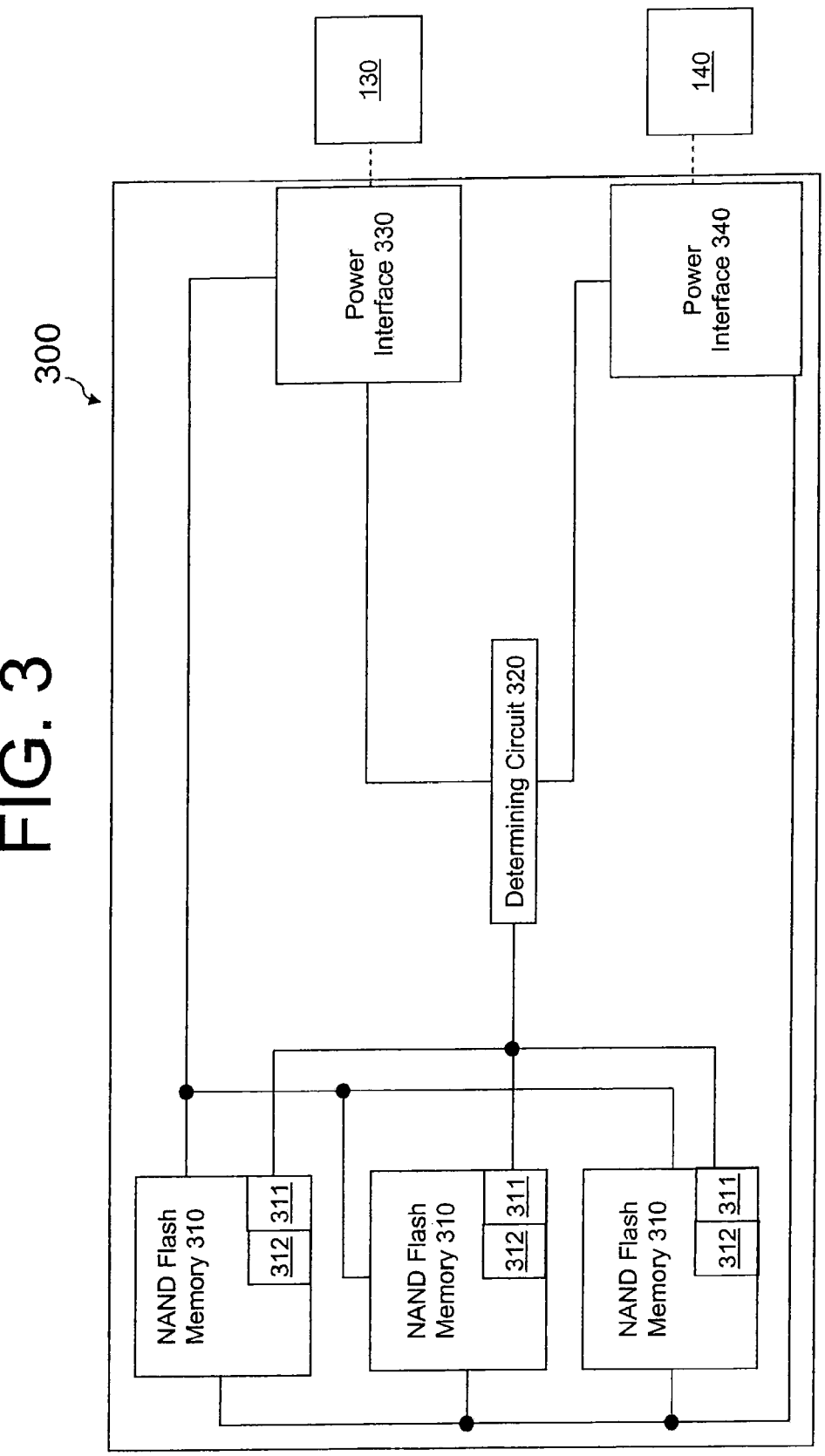
FIG. 3 is a block diagram of a second exemplary portable device including a plurality of memories constructed in accordance with the invention.

FIG. 3 illustrates a second exemplary portable memory device 300 including a plurality of NAND flash memories 310 constructed in accordance with the invention. Portable memory device 300 includes a first power interface 330, second power interface 340, determining circuit 320, and a plurality of NAND flash memories, illustrated as first, second and third NAND flash memories 310. Each NAND flash memory 310 includes a control circuit 311, which may be accessed by the determining circuit 320, and a command/configuration register 312.

The first power interface 330 is used to connect portable memory device 300 to depletable power source 130, and second power interface 340 is used to connect portable memory device 300 to non-depletable power source 140. Determining circuit 320 determines which power interface 330, 340 is receiving power for portable memory device 300. If determining circuit 320 detects that power is being received through second power interface 340, no further action is taken by determining circuit 320, and NAND flash memories 310 are allowed to draw any power required from non-depletable power source 140 via second power interface 340 for operation.

However, if determining circuit 320 detects that power is being received from depletable power source 130 through first power interface 330, then determining circuit 320 instructs each control circuit 311 within each NAND flash memory 310 to utilize power according to predetermined trade-off conditions, which are stored by a user as one or more values in each command/configuration register 312. Control circuit 311 accesses the one or more values from command/configuration register 312 corresponding to the predetermined trade off condition, and instructs other circuitry (not shown) within the respective NAND flash memory 310 to perform accordingly.

As discussed above, the power consumption regulation may be effected, for instance, by decreasing the speed of write operations of the plurality of NAND flash memories 310 by controlling a write command clock frequency, or by decreasing the maximum current supplied to the plurality of NAND flash memories 310 through a current limiting circuit. Another trade-off would be to divide power among the plurality of NAND flash memories 310 according to predetermined settings. For example, access to one or more of the NAND flash memories 310 may be inaccessible or have limited accessibility, which is controlled by the respective control circuits 311.

In an alternate embodiment, the non-depletable power source 140 may be connected through the first power interface 330. For instance, the non-depletable power source 140 may be supplied to and through the depletable power source 130, such as occurs during charging or re-charging of a battery or other type of depletable power source. In that case, configuration/command register 320 may also detect the non-depletable power source 140 through the first interface 330.

Figure 4B:
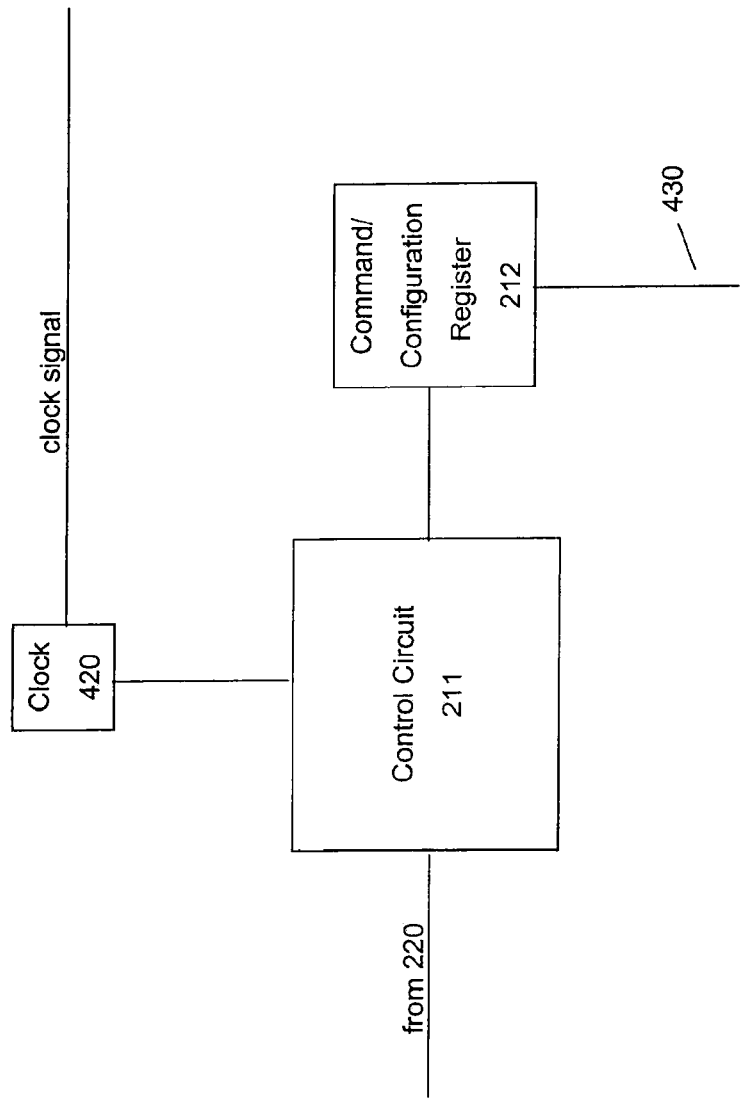

FIGS. 4A and 4B are block diagrams of the memory 210 constructed in accordance with the invention. FIG. 4A shows a memory constructed for current limiting, in which the control circuit 211 receives the result of the determination from determining circuit 220 and accesses a value stored in command/configuration register 212, where the value has been pre-programmed via line 430. Control circuit 211 then instructs a current limiting circuit 410, which receives power from either power interface 230 or power interface 240, whether to limit power to the rest of the memory 210 (not shown). FIG. 4B shows a memory constructed for timing alteration, in which the control circuit 211 receives the result of the determination from determining circuit 220 and accesses a value stored in command/configuration register 212, where the value has been pre-programmed via line 430. Control circuit 211 then instructs a clock 420 whether to alter timing to the rest of the memory 210 (not shown).

FIG. 4C shows a memory constructed for both current limiting and timing alteration, wherein the value preprogrammed in command/configuration register 212 via line 430 allows control circuit 211 to determine whether to perform current limiting or timing alteration if determining circuit 220 has determined that depletable power source 130 is powering the portable memory device 200. In an alternate embodiment, a similar configuration may be used for memories 310.

Figure 5:
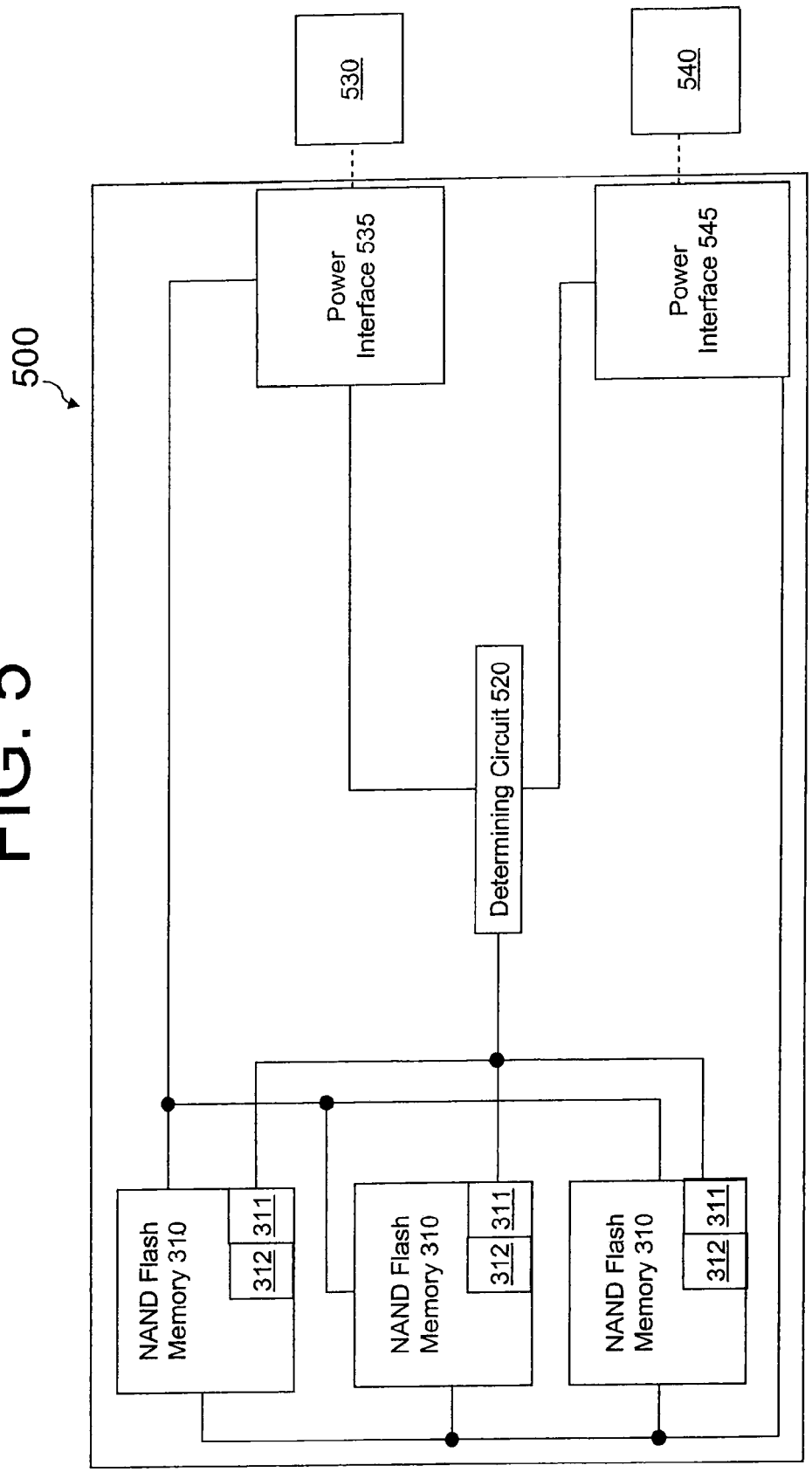
FIG. 5 is a block diagram of a third exemplary portable device including a plurality of memories constructed in accordance with the invention.

FIG. 5 illustrates a third exemplary portable memory device 500 including a plurality of NAND flash memories 310 constructed in accordance with the invention as shown in FIG. 3. Portable memory device 500 includes other circuits numbered as in FIG. 3 and described above. Portable memory device 500 may be connected to a current-dependent power supply 530 through first power interface 535, or to a current-independent power supply 540 through second power interface 545.

Determining circuit 520 determines which power interface 535, 540 is receiving power for portable memory device 500. If determining circuit 520 detects that power is being received through second power interface 545, no further action is taken by determining circuit 520, and NAND flash memories 310 are allowed to draw any power required from current-independent power source 540 via second power interface 545 for operation.

However, if determining circuit 520 detects that power is being received from current-dependent power source 530 through first power interface 535, then determining circuit 520 instructs each control circuit 311 within each NAND flash memory 310 to utilize power according to predetermined trade-off conditions, which are stored as one or more values in each command/configuration register 312. Further control of NAND flash memories 310 is implemented as described for FIG. 3. The above control of portable memory device 500 would also apply to a single memory, as illustrated in FIG. 2 for NAND flash memory 210.

In an alternate embodiment, the current-independent power source 540 may be connected through the first power interface 535. In that case, configuration/command register 520 may also detect the current-independent power source 540 through the first interface 535.

Figure 6:
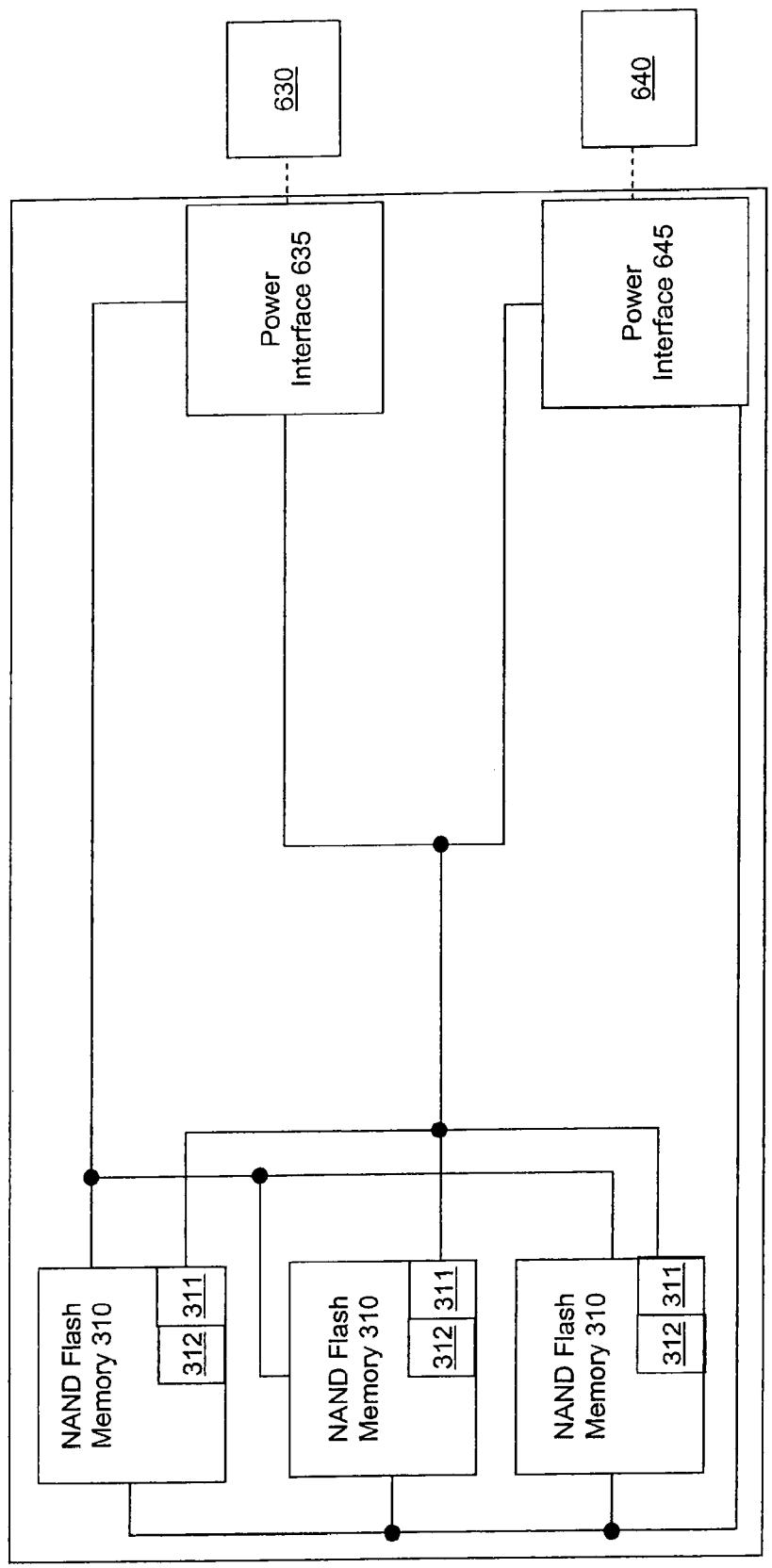
FIG. 6 is a block diagram of a fourth exemplary portable device including a plurality of memories constructed in accordance with the invention.

FIG. 6 illustrates a block diagram of a fourth exemplary portable device including a plurality of memories constructed in accordance with the invention. Portable memory device 600 includes other circuits numbered as in FIG. 3 and described above. Portable memory device 600 may be connected to a depletable or current-dependent power supply 630 through first power interface 635, or to a non-depletable or current-independent power supply 640 through second power interface 645. Such power supplies are similar to those described in FIGS. 3 and 5 above. Portable memory device 600 differs from the above-described embodiments in that there is no separate determining circuit, and the determination is made by the user, i.e., system designer, when the portable memory device 600 is manufactured to enable the behavior change for any power supply condition or other environmental influence. Such determination would be made, for instance, when a plurality of NAND flash memories 310 are used in portable memory device 600. Each control circuit 311 within each of the NAND flash memories 310 would be preset to utilize power according to predetermined trade-off conditions, which are stored as one or more values in each command/configuration register 312.

Therefore, the system designer may select from a series of predetermined operating points which trade-off performance for a reduction of peak currents and store suitable operating values in one or more locations of the command/configuration registers 212, 312. This allows the system designer to adjust current profiles depending on how many devices are used together or other factors that may impact their system design. The system designer can also change, through software, the setting of the trade-off points depending on the operational mode of the device. For instance, upon detection of the handheld device being plugged into external power source, the software may set the internal setting to the maximum performance setting. In addition, a signal may be received from an external source to indicate whether power is supplied from a depletable power source or a non-depletable power source, or from a current-dependent or current-independent power source.

In this way, the device can download information from a computer or another platform while displaying very good functionality. For instance, when the device is unplugged and is operating in the battery mode, the software may change the setting to be more power efficient by providing less device performance. There are other modes for which these trade-offs can be made; the current vs. speed of programming in the NAND device being just one example of such a trade-off.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the portable digital device may be a portable computer, personal digital assistant (PDAs), digital camera, portable music player, cellular telephone, or other device employing flash memory. Non-limiting examples of depletable power source 130 include a battery, a gel type or other type of capacitor or supercapacitor, solar cell, or other depletable power source. Non-limiting examples of current-dependent power supply 530 include a regulator, transformer, AC power adapter, or other power conversion device. Non-limiting examples of non-depletable power source 140 or current-independent power source 540 include an AC wall outlet, power drawn from a computer connection, such as a USB connection, or a DC generator. Additional trade-off conditions would also apply and appropriate predetermined operating points would be set. Other behavior may require alteration based on the environment of the memory device or memory devices, such as temperature, moisture, electromagnetic interference (EMI), etc. Such behavior can be detected by a detection circuit and prestored operating parameters selected in accordance with the detection to select an operating condition of the device with the detected environmental influence. Alternatively, a user, such as a system designer, can select among pre-stored operating parameters in accordance with the desired use of the device.

Moreover, the portable memory device 300 and portable memory device 500 are not limited to the shown three NAND flash memories 310. Any plurality of NAND flash memories may be used, including a dual-stack with two memories and a quad-stack with four memories. The invention may also be used for other types of memory and memory devices, or other integrated circuits where power management is desired, or where a trade-off between current consumed and operating speed is desired.

As noted, although the invention has been described with a memory device, it can be used with any integrated circuit device as long as it contains pre-stored operating parameters which may be selected by an environmental influence detection circuit or a user in accordance with environmental use conditions.

Thus, the invention is not to be seen as limited by the foregoing description, but only by the scope of the appended claims.

What is claimed as new and desired to be protected by Letters Patent of the United States is:

1. A memory device comprising:
   a memory and associated circuitry for operating said memory to read, write, and erase data;
   a detection circuit for determining whether said memory and associated circuitry are powered by a depletable power supply;
   a control circuit coupled to said detection circuit for changing a behavior of said memory and associated circuitry to regulate power consumption if it is determined that said memory and associated circuitry are powered by a depletable power supply; and
   a clock controlled by the control circuit, said clock providing a clock signal to the memory and associated circuitry to regulate power consumption.

2. The device of claim 1, wherein, when said device is powered by a non-depletable power supply, said control circuit does not change the behavior of said memory and associated circuitry.

3. The device of claim 2, wherein said control circuit changes the behavior of said memory by instructing the clock to modify the clock signal to decrease a speed of write operations of said memory.

4. The device of claim 2, wherein said control circuit changes the behavior of said memory by decreasing the current supplied to said memory and associated circuitry.

5. The device of claim 2, wherein said control circuit changes the behavior of said memory by selling predetermined operating points for trade-off parameters.

6. The device of claim 2, further comprising:
   a first power interface for coupling said device to said depletable power supply; and
   a second power interface for coupling said device to said non-depletable power supply.

7. The device of claim 2, further comprising:
   a power interface for coupling said device to said depletable power supply and said non-depletable power supply.

8. The device of claim 1, further comprising a plurality of memories.

9. The device of claim 8, wherein said control circuit changes the behavior of said memory by dividing power from said depletable power supply among said plurality of memories.

10. The device of claim 8, wherein said plurality of memories comprises one of a dual-stack or a quad stack.

11. The device of claim 2, wherein said memory comprises a flash memory.

12. The device of claim 11, wherein said flash memory comprises a NAND flash memory.

13. A method of managing power consumption by a memory in a memory device comprising:
   receiving a signal indicating that said device is powered by a depletable power supply; and
   based on the receiving of the signal, changing a clock signal input to said memory to regulate power consumed by said memory.

14. The method of claim 13, wherein said changing step comprises decreasing a speed of write operations of said memory.

15. The method of claim 13, further comprising decreasing the maximum current supplied to said memory.

16. The method of claim 13, further comprising pre-setting predetermined conditions for said memory device.

17. The method of claim 13, further comprising shutting down said memory device.

18. The method of claim 13, wherein said memory comprises a flash memory.

19. The method of claim 18, wherein said flash memory comprises a NAND flash memory.

* * * * *